Aug. 20, 1968 C. G. CURRIN ET AL 3,397,447

METHOD OF MAKING SEMICONDUCTOR CIRCUITS

Filed Oct. 22, 1964

INVENTOR.
CEDRIC G. CURRIN
JOHN S. HOOD

BY Howard W. Hermann

ATTORNEY 3,397,447

METHOD OF MAKING SEMICONDUCTOR CIRCUITS

Cedric G. Currin, Midland, Mich., and John S. Hood, Pittsburgh, Pa., assignors to Dow Corning Corporation, Midland, Mich., a corporation of Michigan Filed Oct. 22, 1964, Ser. No. 405,746
4 Claims. (Cl. 29—577)

ABSTRACT OF THE DISCLOSURE

Integrated semiconductor circuit produced by applying a layer of refractory material, such as silicon carbide, to a thin semiconductor crystal. Areas of the semiconductor crystal are formed into electronic devices and the remaining areas removed leaving the refractory material as a mechanical substrate and electrical isolation material for the circuit. Electrical connections and thin film passive devices may be applied as desired and upon completion an insulating layer may be applied over the entire device.

The present invention relates to the fabrication of miniature electronic circuits, and more particularly, to the field of integrated and thin film semiconductor circuits.

For various reasons, including greater complexity of electronic circuitry with the advancing state of the art, the opportunity to produce desired results with much smaller power consumption, and the need and desirability of producing circuits which are smaller, lighter, and more reliable than prior art circuits, there has been a continuous trend toward the use of ultra-miniature semiconductor circuits in various applications. It has been found that conventional circuit techniques have not been adequate for use in this approach.

Basically, there are at present three approaches to microminiaturization. In the so-called monolithic, or fully integrated circuit, active and passive components are fabricated from a single chip of semiconductor crystal. While this technique has been found satisfactory for active elements such as transistors, diodes and other semiconductors, some types of passive elements, particularly inductances, have been difficult to obtain with this technique.

A second approach has been thin film circuits wherein active and passive elements are fabricated by evaporating, depositing, or otherwise applying appropriate conducting, semiconducting, and insulating materials to an insulating substrate. While this technique works fairly well with most types of passive elements, the active elements have been difficult to obtain in this manner.

Accordingly, a third approach which was a hybrid of the fully integrated or monolithic circuit technique and the thin film circuit technique has been tried. This approach involves deposition of passive elements on one substrate and diffusion of active elements into bulk semiconductor material. This provides the superior active elements of the integrated approach and the isolation and accuracy of passive elements as provided by the thin film approach.

A problem with the hybrid approach to date, has been the need in known techniques for separate processing of semiconducting crystal and substrate. This is time-consuming and costly and also creates difficulties in final assembly.

Accordingly, a major object of the present invention is the provision of a method of fabricating a hybrid type microelectronic circuit which obviates the need for separate processing of semiconductor crystal and substrate.

A further object is to provide a fabrication technique for hybrid microelectronic circuits wherein the semiconducting crystal and insulating substrate may be processed together as a unit.

In accordance with these and other objects of the present invention, a layer of refractory material is applied to a thin semiconductor crystal to serve as an insulating mechanical substrate. Active devices are built into the crystal and unnecessary portions of the crystal are removed by photomasking and etching, or other standard techniques. Thin film devices are then fabricated on the exposed areas.

Further objects and many other attendant advantages of this invention will become more apparent to those skilled in the art by a consideration of the following detailed description when considered in connection with the accompanying drawings wherein.

Figure 1:
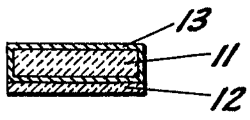
FIG. 1 is a cross-sectional view of a semiconductor crystal with a layer of refractory material affixed thereto as a mechanical substrate.

Referring now to the drawings wherein like reference characters designate like or corresponding parts throughout the several views, there is shown in FIG. 1 a thin semiconductor crystal 11. The semiconductor crystal may be a slice of a cylindrical crystal, a length of dendritic web crystal, or a thin crystal grown in any other fashion. It may be silicon, germanium, silicon carbide, or any other known semiconductor having the desired characteristics.

A layer of refractory material 12 is applied to the thin crystal 11 to serve as a mechanical substrate. The material chosen for the substrate must be one that can be applied to the particular type of crystal and which has a coefficient of linear expansion which is very near that of the material of the crystal. During heating and cooling the crystal and substrate must expand and contract at very nearly the same rate to avoid stresses which would cause cracking of the substrate or crystal. The material must be able to withstand the heat required for deposition without contaminating the crystal and it must be a good electrical insulator. In the case of a silicon crystal, suitable substrate materials include silicon carbide, silicon oxides and alumina. In general, the substrate material may be a fired ceramic, deposited glass, or quartz, or a sprayed and fired material is sometimes suitable.

The semiconductor crystal must be of sufficient thinness for suitable semiconductor device operation and for convenient removal of the unused areas. If desired, a thin oxide layer 13 may be deposited over the surface of the crystal to protect it against contamination and damage. In the case of a silicon crystal this may be silica, for example.

Figure 2:
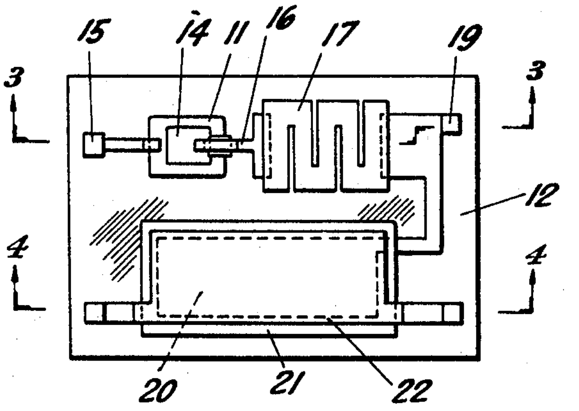
FIG. 2 is a top view of a completed circuit made in accordance with the present invention from a crystal and substrate such as those shown in FIG. 1.
Figure 3:
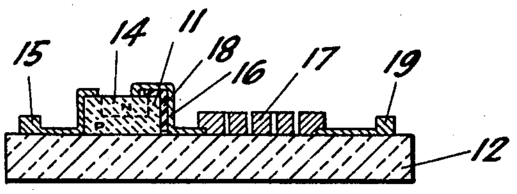
FIG. 3 is a cross-sectional view of the circuit of FIG. 2 taken along the line III—III of FIG. 2.
Figure 4:
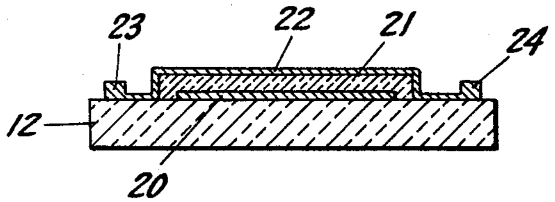
FIG. 4 is a cross-sectional view taken along the line IV—IV of FIG. 2.

In FIGS. 2–4, there is shown a completed circuit for purposes of illustrating the application of the present invention to a practical embodiment. Assuming the original semiconductor crystal 11 to be p-type, n-type material 14 is diffused into it thus creating a p-n junction shown by the broken line of FIGS. 2–3. Obviously, the original crystal may be n-type if desired, and p-type material may be diffused to create junctions as is well known in the art. Also it is possible to diffuse a second junction into the first diffused material by known methods and any number of diffusing steps may be made.

In the embodiment chosen to be illustrated in FIGS. 2–4, however, the only necessary active semiconductor device is a diode; hence a single p-n junction is all that is necessary. After the junction has been diffused, the area immediately surrounding the junction is masked and the remainder of the crystal 11 is etched away to expose the insulating substrate 12 over the remainder of the substrate area. Etching techniques are also well known in the art and constitute no part of the present invention. After the substrate has been exposed, passive elements and electrical interconnections are deposited on the substrate to complete the device.

As shown in FIG. 2, an input terminal and lead 15 are connected to the p-type material 11 of the diode. Terminals and leads are, of course, made from materials which are good electrical conductors and which are easily deposited on and made a good connection with the materials which they must interconnect. Aluminum, for example, has been used for this purpose. A lead 16 connects the n-type material 14 of the crystal to a resistive element 17 which may be made of deposited Nichrome or tin oxide, for example, a layer 18 of insulating material such as silica must be interposed between the lead 16 and the p-type crystal material. An output terminal 19 is connected to the other end of the resistor 17 and also to one plate 20 of a capacitor. A layer of refractory material 21, such as silica or alumina, is placed over the first plate 20, and a second plate 22 is deposited over the refractory layer. The capacitor plates may be of the same material as the interconnecting leads for ease in fabrication, thus allowing leads and plates to be deposited in one step. The second plate 22 is connected to input and output terminals 23 and 24 respectively. If desired, an insulating layer such as silica may be deposited over the entire completed device except for the terminals to protect it against damage.

Many modifications and variations of the invention may be made in accordance with known techniques. Accordingly, within the scope of the appended claims the invention may be practiced otherwise than as specifically described.

That which is claimed is:

1. The method of making a semiconductor electronic circuit element which consists of:

growing a thin dendritic web of monocrystalline silicon, cutting a length from said web, depositing a layer of electrically insulating material thick enough to be self-supporting over one entire face of said length, said insulating material being chosen from the group consisting of silicon carbide, silicon oxide, and alumina, doping at least a portion of the reverse side of said length to form at least one p-n junction therein, removing other portions of said crystal from said layer of insulating material in accordance with a predetermined pattern, and depositing on said layer in a location bared by said removal at least one thin film passive electrical component adapted to be connected to said crystal to complete said circuit element.

2. Method as defined in claim 1 and further comprising depositing an electrically insulating layer over the completed circuit.

3. A method of making a semiconductor electronic circuit element which consists of forming a thin, flat body of monocrystalline silicon, depositing a layer of electrically insulating material thick enough to be self-supporting over one entire face of said body, said insulating material being chosen from the group consisting of silicon carbide, silicon oxide, and alumina, doping at least a portion of the reverse side of said body to form at least one p-n junction therein, removing other portions of said crystal from said layer of insulating material in accordance with a predetermined pattern, and depositing on said layer at a location bared by said removal at least one thin film passive electric component adapted to be connected to said monocrystalline silicon to complete said circuit element.

4. A method as defined in claim 3 and further including depositing an electrically insulating layer over the completed circuit.

References Cited

UNITED STATES PATENTS

| | | | |
|---|---|---|---|
| 2,978,804 | 4/1961 | Soper et al. | 29—413 |
| 3,138,744 | 6/1964 | Kilby | 317—101 |
| 3,152,939 | 10/1964 | Borneman et al. | |
| 3,158,788 | 11/1964 | Last. | |
| 3,258,898 | 7/1966 | Garibotti | 29—577 |
| 3,264,712 | 8/1966 | Hayashi et al. | 29 |
| 3,290,753 | 12/1966 | Chang | 29—577 |

WILLIAM I. BROOKS, *Primary Examiner.*